United States Patent [19]
Sasaki et al.

[11] Patent Number: 5,321,400
[45] Date of Patent: Jun. 14, 1994

[54] SERIAL DATA INTERFACE CIRCUIT DEALING WITH A PLURALITY OF RECEIVING MODES

[75] Inventors: Makoto Sasaki, Tokyo; Hiroshi Nameki, Kanagawa, both of Japan

[73] Assignee: NEC Corporation, Tokyo, Japan

[21] Appl. No.: 27,023

[22] Filed: Mar. 5, 1993

[30] Foreign Application Priority Data

Mar. 13, 1992 [JP] Japan .................................. 4-055766

[51] Int. Cl.⁵ .......................................... H03M 9/00
[52] U.S. Cl. ..................................... 341/100; 341/50
[58] Field of Search ............................. 341/100, 50

[56] References Cited

U.S. PATENT DOCUMENTS

| | | | |
|---|---|---|---|
| 4,554,529 | 11/1985 | Moriyami et al. | 341/95 |
| 4,901,076 | 2/1990 | Askin et al. | 341/100 |
| 5,055,661 | 10/1991 | Gochi | 235/492 |
| 5,099,481 | 3/1992 | Miller | 371/22.1 |
| 5,192,950 | 3/1993 | Stephenson, Jr. | 341/100 |

Primary Examiner—Marc S. Hoff
Attorney, Agent, or Firm—Whitham & Marhoefer

[57] ABSTRACT

A serial interface circuit for performing operations in a plurality of modes is disclosed, which includes an input terminal supplied with a serial data, a first shift register fetching and shifting data at the input terminal in synchronism with a clock signal, a selector for selecting the input terminal in a first mode and an output of the first shift register in a second mode, a second shift register fetching and shifting data at an output of the selector, a set of first output terminals, a set of second output terminals, and an output control circuit outputting first data derived in parallel from the first shift register and second data derived in parallel from the second shift register to the first and second output terminals in the second mode and one of the first and second data to one of the first and second output terminals in the first mode. The respective operations in the first and second modes are thus performed. The output control is favorably incorporated with a bit order reversing function.

9 Claims, 7 Drawing Sheets

|  |  | | | | | | | | | | | | | | | | |
|---|---|---|---|---|---|---|---|---|---|---|---|---|---|---|---|---|---|
| Mode (1) | Serial Input Data | D15 | D14 | D13 | D12 | D11 | D10 | D9 | D8 | D7 | D6 | D5 | D4 | D3 | D2 | D1 | D0 |
|  | Parallel Output Data | D15 | D14 | D13 | D12 | D11 | D10 | D9 | D8 | D7 | D6 | D5 | D4 | D3 | D2 | D1 | D0 |
| Mode (2) | Serial Input Data | D7 | D6 | D5 | D4 | D3 | D2 | D1 | D0 | - | - | - | - | - | - | - | - |
|  | Parallel Output Data | D7 | D6 | D5 | D4 | D3 | D2 | D1 | D0 | 0 | 0 | 0 | 0 | 0 | 0 | 0 | 0 |
| Mode (3) | Serial Input Data | D0 | D1 | D2 | D3 | D4 | D5 | D6 | D7 | D8 | D9 | D10 | D11 | D12 | D13 | D14 | D15 |
|  | Parallel Output Data | D15 | D14 | D13 | D12 | D11 | D10 | D9 | D8 | D7 | D6 | D5 | D4 | D3 | D2 | D1 | D0 |
| Mode (4) | Serial Input Data | D0 | D1 | D2 | D3 | D4 | D5 | D6 | D7 | - | - | - | - | - | - | - | - |
|  | Parallel Output Data | D7 | D6 | D5 | D4 | D3 | D2 | D1 | D0 | 0 | 0 | 0 | 0 | 0 | 0 | 0 | 0 |

FIG.6

SERIAL DATA INTERFACE CIRCUIT DEALING WITH A PLURALITY OF RECEIVING MODES

BACKGROUND OF THE INVENTION

The present invention relates to a serial data interface circuit and, more particularly, to a serial data receiving circuit acceptable to a plurality of data receiving modes.

Serial data transfer is widely employed as a means for transferring data among a plurality of units. For example, a microcomputer as a data processing apparatus incorporates a serial data interface circuit to serially transfer processed data to a peripheral unit and/or to serially receive data to be processed from the peripheral unit. The data received serially is converted into parallel data which is subjected to a predetermined processing operation. The resultant data may be returned to the peripheral unit by the serial transfer.

From the view point of wide application, it is advantageous to design the bit length of serial-transferred data to be changeable. For instance, it is desirable to couple a 16-bit data processing apparatus with not only a 16-bit peripheral unit but a 8-bit peripheral unit. Further, the bit order of the serial-transferred data is desired to be changeable. This is because some peripheral units transfer data serially from the most significant bit (MSB) thereof and some other peripheral units transfer serial data from the least significant bit (LSB) thereof. The serial data receiving circuit is thus desired to deal with the following four receiving modes (1)-(4):

(1) The circuit receives data having bit length equal to the longest bit length allowed in one serial transfer and converts it into parallel data;

(2) The circuit receives data having bit length less than the longest bit length, converts it into parallel data and outputs only valid bit data;

(3) The circuit receives data having bit length equal to the longest bit length, converts it into parallel data and outputs the parallel data with reversing the bit order thereof; and (4) The circuit receives data having bit length less than the longest bit length, converts it into parallel data and outputs only valid bit data with reversing the bit order thereof.

SUMMARY OF THE INVENTION

It is therefore an object of the present invention to provide a serial data interface circuit which can deal with at least two different data receiving modes with less hardware.

It is another object of the present invention to provide a serial data transfer circuit dealing with four data receiving modes without increasing the required hardware remarkably.

A circuit according to the present invention comprises an input terminal supplied with serially transferred data, a first shift register fetching and shifting data at the input terminal in synchronism with a clock signal, a selector selecting and outputting data at the input terminal in a first receiving mode and data at an output of the first shift register in a second receiving mode, a second shift register fetching and shifting data outputted from the selector in synchronism with the clock signal, a plurality of first output terminals, a plurality of second output terminals, the first shift register outputting first data in parallel and the second shift register outputting second data in parallel, a first output circuit activated in the first receiving mode for outputting one of the first and second data to one of the first and second output terminals, and a second output circuit activated in the second receiving mode for outputting the first and second data to the first and second output terminals, respectively.

With such a circuit construction, the serial data supplied to the input terminal are fetched and shifted by the first and second shift registers in sequence in the first receiving mode, and then converted into parallel data by the shift registers, the parallel data thus converted being in turn outputted to the output terminals. The data receiving operation according to the above first mode (1) is thereby performed. On the other hand, in the second receiving mode, the first and second shift registers fetch and shift the data serially supplied in parallel to each other, and the parallel data derived from one of them is outputted to the output terminals. The data receiving operation adaptive to the above second mode (2) is thus performed. As to hardware, only the selector and a control circuit for selectively activating the output circuits are required, so that less hardware is refused.

It is favorable to incorporate a bit reverse function into the output circuits, so that the above receiving modes (3) and (4) are also carried out.

BRIEF DESCRIPTION OF THE DRAWINGS

The above and other objects, advantages and features of the present invention will be more apparent from the following description taken in conjunction with the accompanying drawings, in which

FIG. 6 is a diagram illustrative of parallel output data to the serial input data in the four modes (1)-(4)

DETAILED DESCRIPTION OF THE INVENTION

Figure 1:
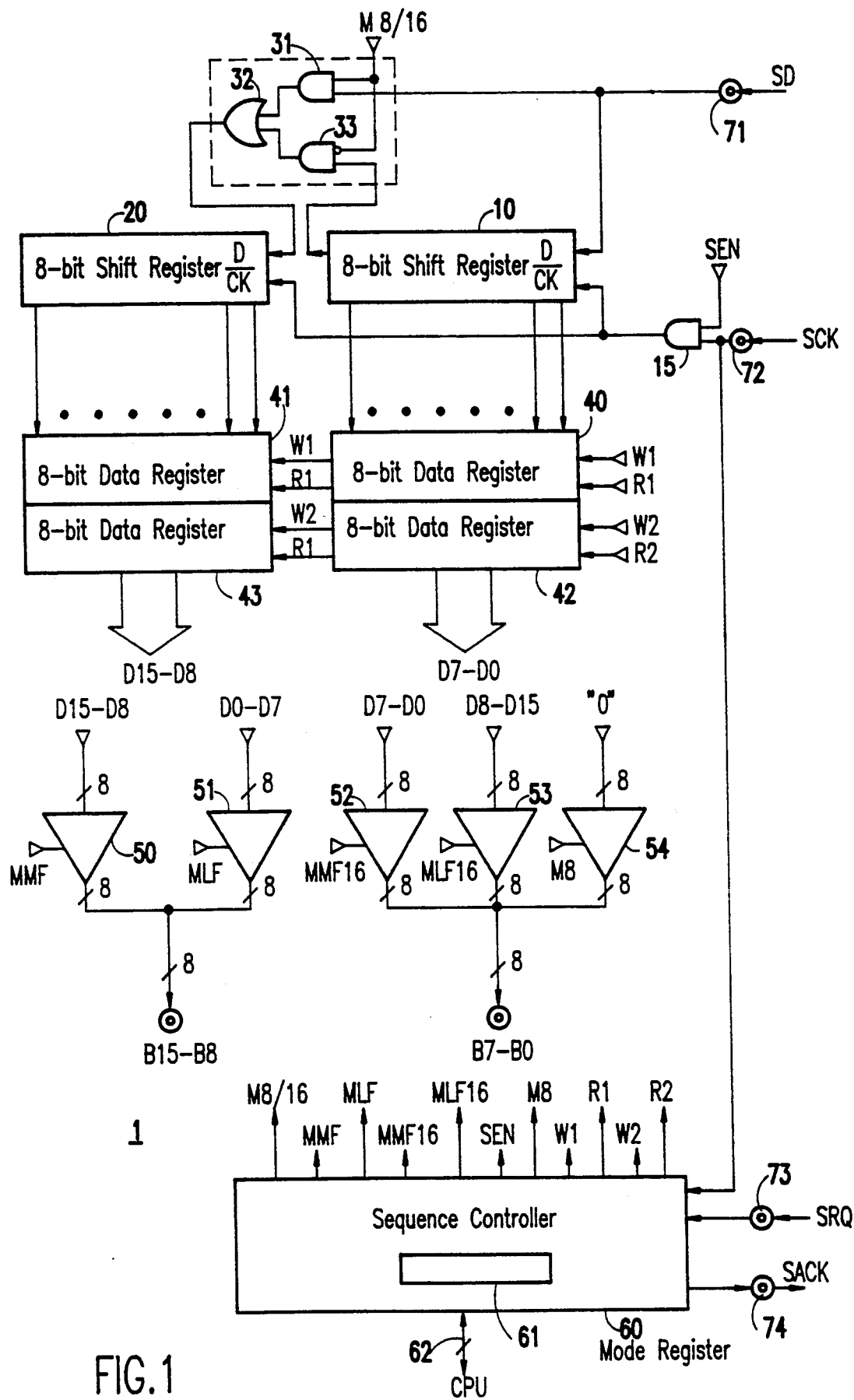
FIG. 1 is a block diagram illustrative of an embodiment of the present invention.

Referring to FIG. 1, a serial data receiving circuit according to an embodiment of the present invention is provided as an I/O (Input/Output) unit of a 16-bit microcomputer or CPU (not shown) and receives serial data from a peripheral unit (not shown) connected to terminals 71-74. The terminal 71 is supplied with serial-data SD and the terminal 72 is supplied with a serial clock signal SCK. The terminal 73 is supplied with a serial data transfer request signal SRQ and a transfer-enable signal is returned from the terminal 74 to the peripheral unit as a transfer acknowledge signal SACK.

Since the CPU processes data in 16-bit (two bytes) units, the present circuit 1 receives the serial data of 16-bit length maximum per transfer. However, a 16-bit shift register as a serial-parallel converter is divided into two 8-bit shift registers 10 and 20 in accordance with the present invention. The data input terminal D of the shift register 10 is connected to the terminal 71 and the data input terminal D of the shift register 20 is connected to a selector 16 composed of two AND gates 31 and 33 and one OR gate 32 which are connected as shown. Accordingly, when a mode signal M8/16 takes the low or "0" level, the selector 30 selects the output of the shift register 10. On the other hand, in the case of the high or "1" level of the signal M8/16, the terminal 71 is selected by the selector 30. Each of the shift registers 10 and 20 further has a clock terminal CK and fetches and shifts the data supplied to its data terminal D in synchronism with the falling edge of the serial clock signal SCK supplied via an AND gate 15. The AND gate 15 is made open by the active high level of a transfer-enable signal SEN.

Each of the shift registers 10 and 20 further has parallel output terminals from which 8-bit data are outputted. These data are stored in data registers 40-41 or 42-43 by a write signal W1 or W2. The stored data is read out in response to a read signal R1 or R2 as data D0-D7 and D8-D15 (D0 being LSB and D15 being MSB).

The present circuit 1 further has eight output terminals B0-B7 and eight output terminals B8-B15 which are in turn connected to a 16-bit bus (not shown) of the CPU. The data appearing at the output terminals B0-B15 are controlled by five tristate output buffers 50-54. Specifically, the buffer 50 is activated by a signal MMF and transfers the data D8-D15 respectively to the terminals B8-B15 without reversing the bit order thereof, and the buffer 51 is activated by a signal MLF and transfers the data D0-D7 to the terminals B8-B15 with reversing the bit order thereof, respectively. The reverse of the bit order is performed in the present embodiment by interconnection wiring layers between the data D0-D7 and the buffer 51. The buffer 52 is activated by a signal MMF16 and transfers the data D0-D7 to the terminals B0-B7 in that order, and the buffer 53 is activated by a signal MLF16 and transfers the D8-D15 to the terminals B0-B7 with reversing the bit order thereof, respectively. Similarly, the bit order reversing is performed by interconnection wiring layers. The buffer 54 has eight input nodes each supplied with the low level "0" and is activated by a signal M8. Accordingly, the buffer 54, when activated, outputs the data "0" to each of the terminals B0-B7.

The above mentioned control signals as well as the acknowledge signal SACK are generated by a sequence controller 60. This controller includes a mode register 61 whose content designates a data receiving mode to be performed. In the present embodiment, the mode register 61 consists of two bits, and the contents "00", "10", "01" and "11" thereof designate the above receiving modes (1), (2), (3) and (4) respectively.

Assume now that the present data receiving circuit 1 is connected to a 16-bit peripheral unit which transfers data serially from the MSB thereof. The mode register 61 is therefore set with data "00" through a bus 62 by the CPU. That is, this circuit 1 is brought into the receiving mode (1).

Figure 2:
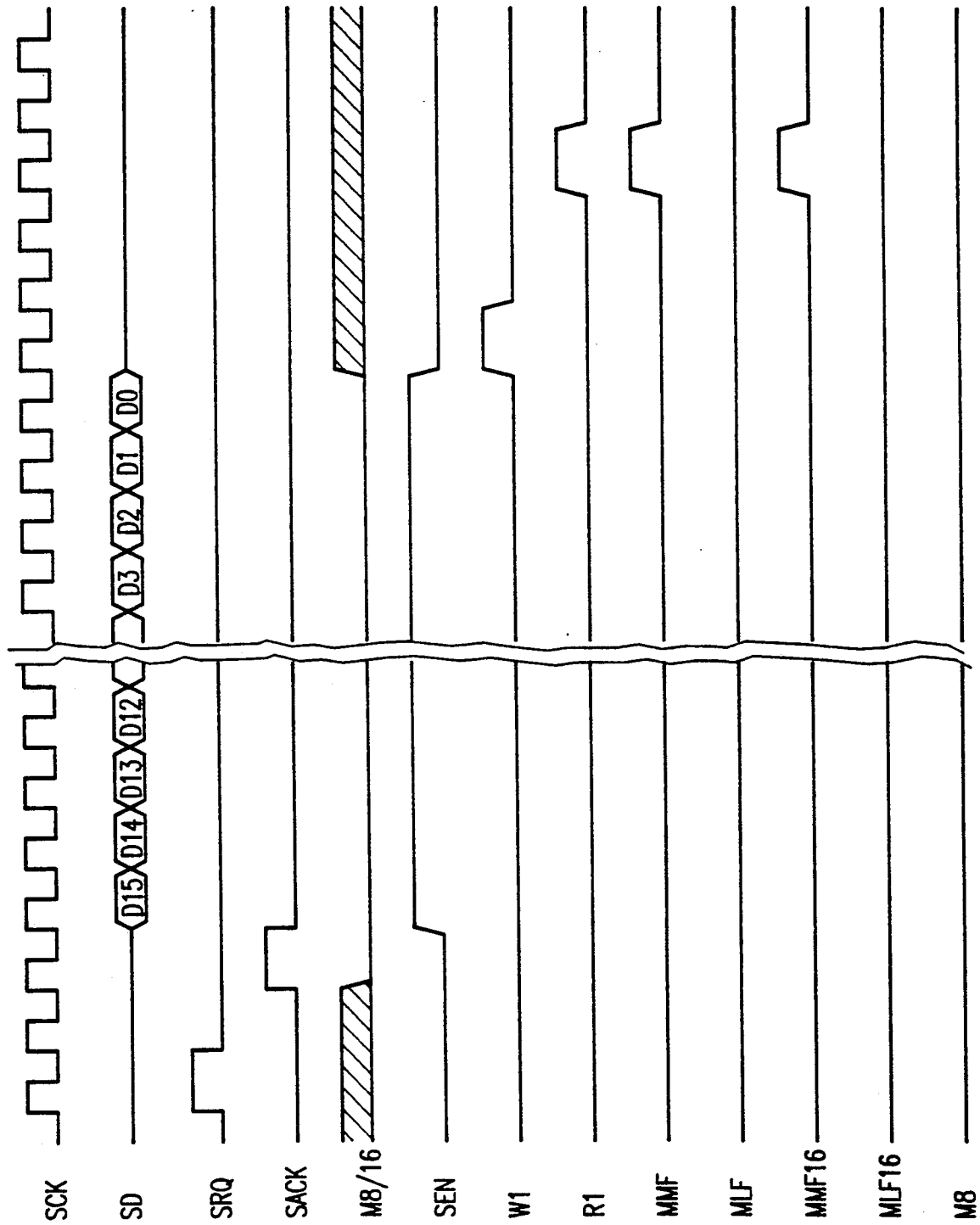
FIG. 2 is a timing chart representative of a serial data receiving operation in the first mode (1)

When the peripheral unit issues a serial data transfer request SRQ, as shown in FIG. 2, the sequence controller 60 detects whether or not the data stored in the data register 40-41 or 42-43 are already read out to the CPU. If the answer is yes, the acknowledge signal SACK is changed to the active high level. Further, the controller 60 generates the low level signal M8/16 to cause the selector 30 to select the output of the shift register 10 (see FIG. 2).

On the other hand, the peripheral unit receiving the acknowledge signal SACK starts to transfer the serial data in synchronism with each leading edge of the serial clock signal SCK from the MSB thereof, as shown in FIG. 2.

The sequence controller then generates the active high level signal SEN to open the AND gate 15. Thus, the serial data SD is fetched and shifted by the shift registers 10 and 20 in sequence in synchronism with each falling edge of the clock signal SCK.

The sequence controller 60 includes a counter (not shown) to count the occurrence of each leading edge of the clock signal SCK. In response to the 17th leading edge of the clock from the transfer start timing, therefore, the signal SEN is changed to the low level to close the AND gate 15 to stop supplying the clock signal SCK to the shift registers 10 and 20. As a result, the 16-bit data thus serially transferred are stored in the registers 10 and 20 such that the MSB D15 is stored in the most significant bit position of the register 20. The data in the registers 10 and 20 are then transferred to the data registers 40 and 41 by the write signal W1. If the registers 42 and 43 are not empty, the write signal W2 is generated to store the data from the shift registers 10 and 20 into the data registers 42 and 43, respectively.

The sequence controller is then brought into a wait state to wait for a data read request by the CPU. If desired, the write signal W1 or W2 may be used for issuing an interrupt request for data read to the CPU. If the peripheral unit issues a next data transfer request during the wait state, the controller 60 returns the acknowledge signal SACK to the peripheral unit only when the remaining data registers are vacant. Otherwise, the transfer request is made held.

In response to the data read request from the CPU, the controller 60 generates the active high level read signal R1. Concurrently, the active high level signals MMF and MMF16 are generated as shown in FIG. 2. As a result, the most significant 8-bit data D15-D8 of the serial data from the register 41 are transferred to the output terminals B15-B8, respectively, and the least significant 8-bit data thereof from the register 40 are transferred to the output terminals B7-B0, respectively. Thus, as shown as mode (1) in FIG. 6, the serial data transferred from the MSB thereof are converted into parallel data having the same bit order as the serial data, and then supplied to the CPU.

Figure 3:
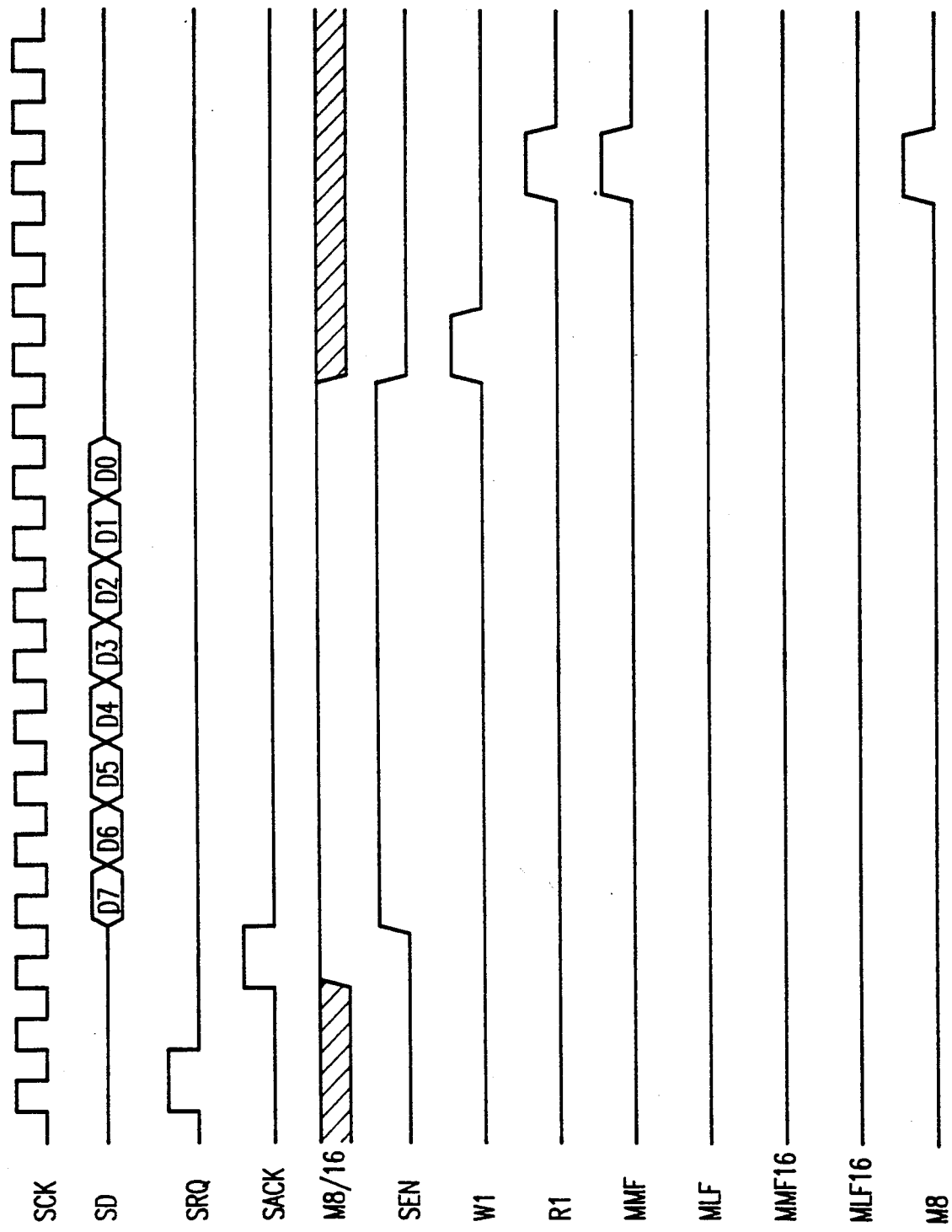
FIG. 3 is a timing chart representative of a serial data receiving operation in the second mode (2)

In the case where a 8-bit peripheral unit, which transfers serial data from the MSB thereof, is connected, the mode register 61 is set with mode data of "10". The same transfer initiation sequence as that described with reference to FIG. 2 is carried out except that the signal M8/16 is held at the low level, as shown in FIG. 3. The selector 30 thereby selects the input terminal 71 in place of the output of the shift register 10. Accordingly, the 8-bit data transferred serially from the peripheral unit are stored into the shift registers 10 and 20 in parallel to each other. That data are then stored into the data registers 40 and 41, respectively, in response to the write signal W1.

In response to the data read request from the CPU, the sequence controller 60 generates the active read signal R1 and further generates the active level signals MMF and M8 (see FIG. 3) because of the second receiving mode (2).

Thus, the 8-bit serial data is converted into the 8-bit parallel data having the same bit order as the input data, and the parallel data is outputted to the most significant 8-bit output terminals B15-B8 with outputting the logic "0" to the least significant output terminals B7-B0, as shown as the mode (2) in FIG. 6. In other words, the 8-bit serial data are outputted to the more significant 8-bit bus of the 16-bit bus through the output terminals B15-B8 and the logic "0" is outputted to each of the least significant 8-bit bus thereof as invalid data. The data receiving mode (2) is thus performed.

Figure 4:
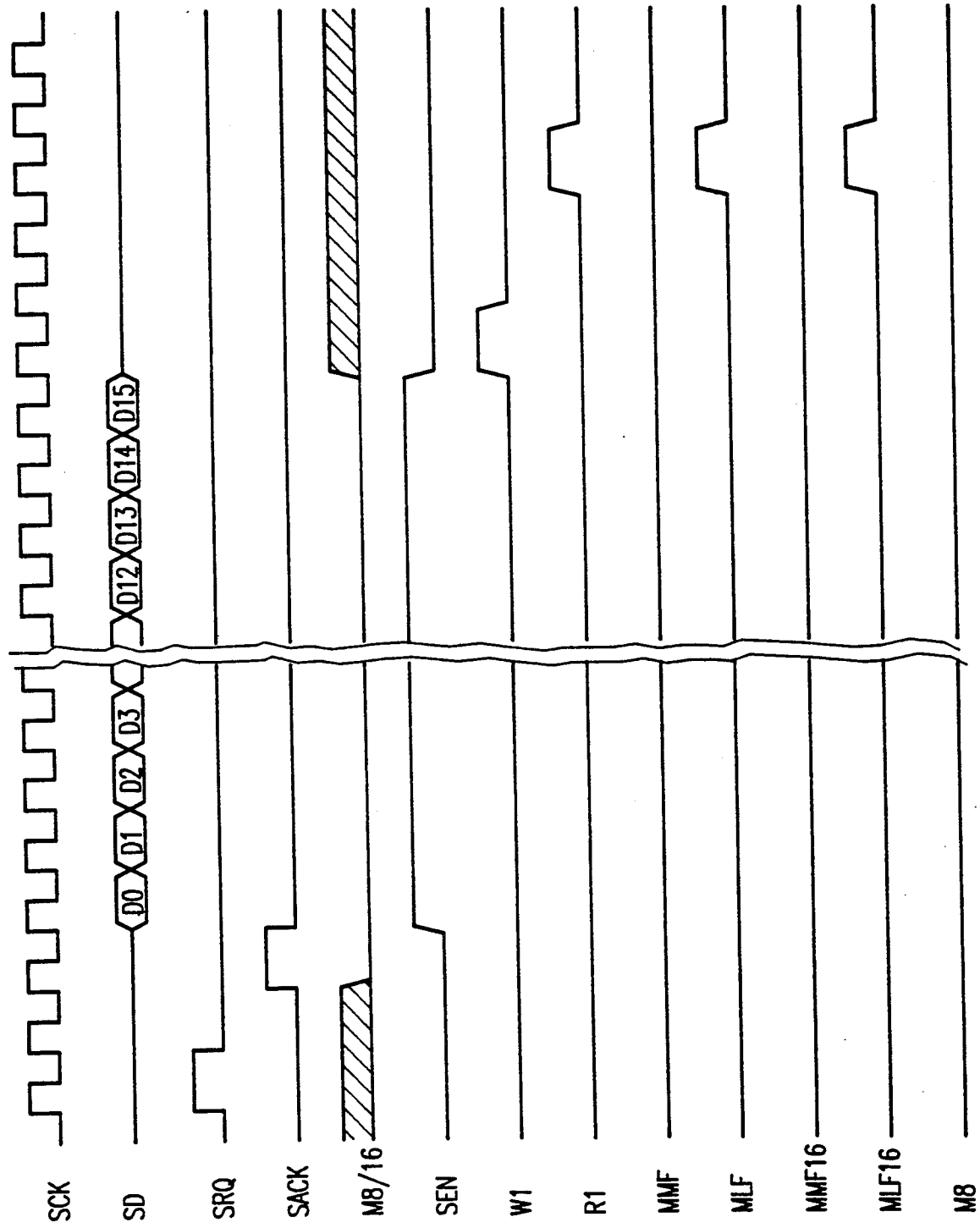
FIG. 4 is a timing chart representative of a serial data receiving operation in the third mode (3)

In the case of coupling a 16-bit peripheral unit transferring data serially from the LSB thereof, the mode register 61 is set with data of "01". A timing chart representative of an operation in this mode is shown in FIG. 4. The sequence of operations from the serial data transfer initiation to the completion of the serial data transfer is the same as that described with reference to FIG. 2.

In response to the data read request from the CPU, the controller 60 generates the active high level signals MLF and MLF16 because of the mode (3). As a result, the data D0-D7 from the register 41 (43) are transferred to the terminals B7-B0 reversing the bit order thereof, respectively, and the data D8-D15 form the register 40 (42) are transferred to the terminals B15-B8 reversing the bit order thereof, respectively. Thus, the 16-bit serial data supplied with the LSB thereof as the first input is converted into the 16-bit parallel data D15-D0 having the reversed bit order to the input data, as shown by the mode (3) in FIG. 6.

Figure 5:
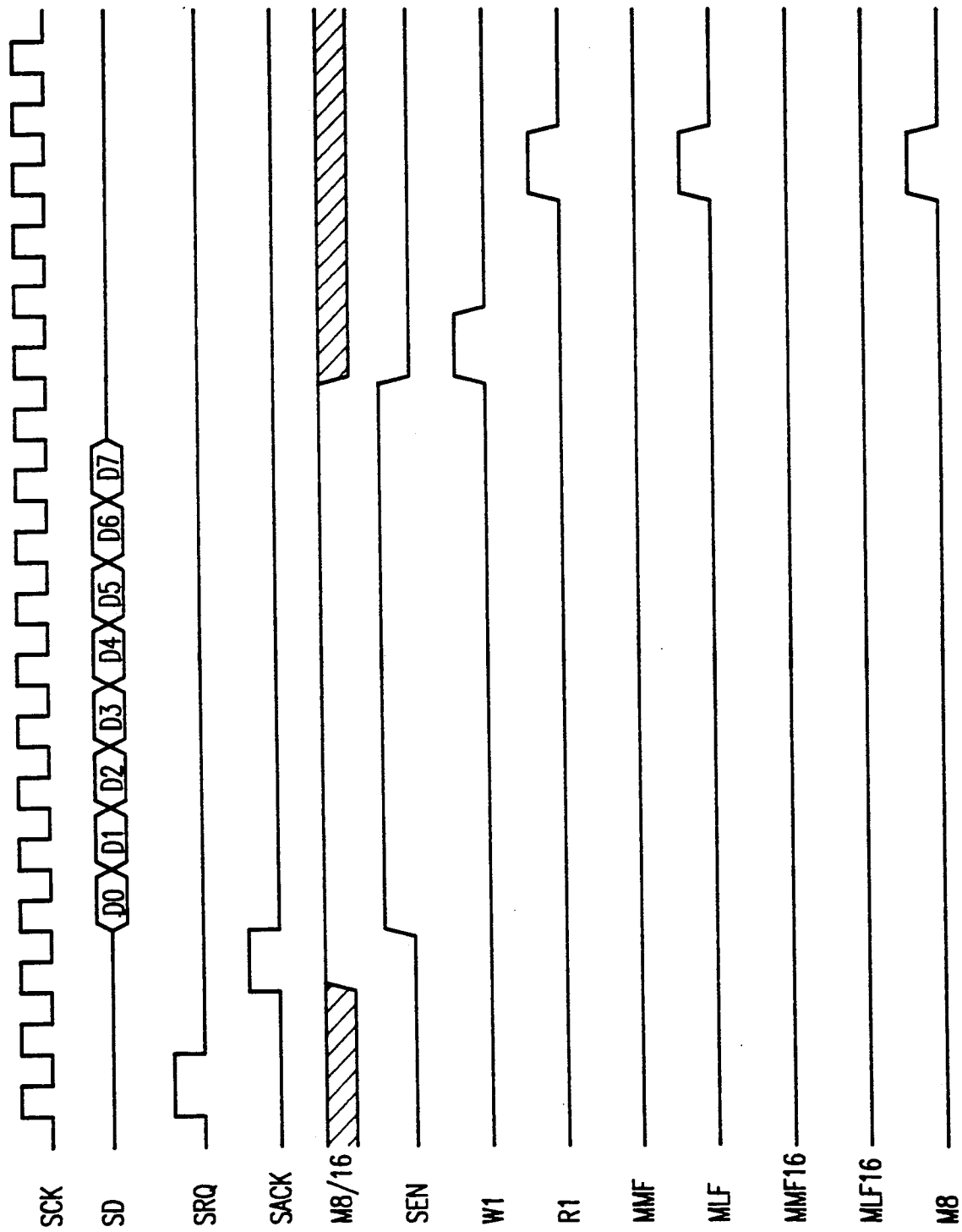
FIG. 5 is a timing chart representative of a serial data receiving operation in the fourth mode (4)

Finally, when a 8-bit peripheral unit, which transfers data from the LSB thereof, is coupled, the mode data "11" is stored into the mode register 61. As a result, the active level signals MLF and M8 are generated by the controller 60 in response to the data read request from the CPU, as shown in FIG. 5. The 8-bit serial data is thus converted into the 8-bit parallel data having the bit order reversed to the original order. That parallel data is transferred to the most significant 8-bit bus while outputting the logic "0" to the least significant 8-bit bus (see mode (4) of FIG. 6).

In view of foregoing, the present serial data receiving circuit 1 performs the respective data receiving operations in four modes (1)-(4).

Figure 7:
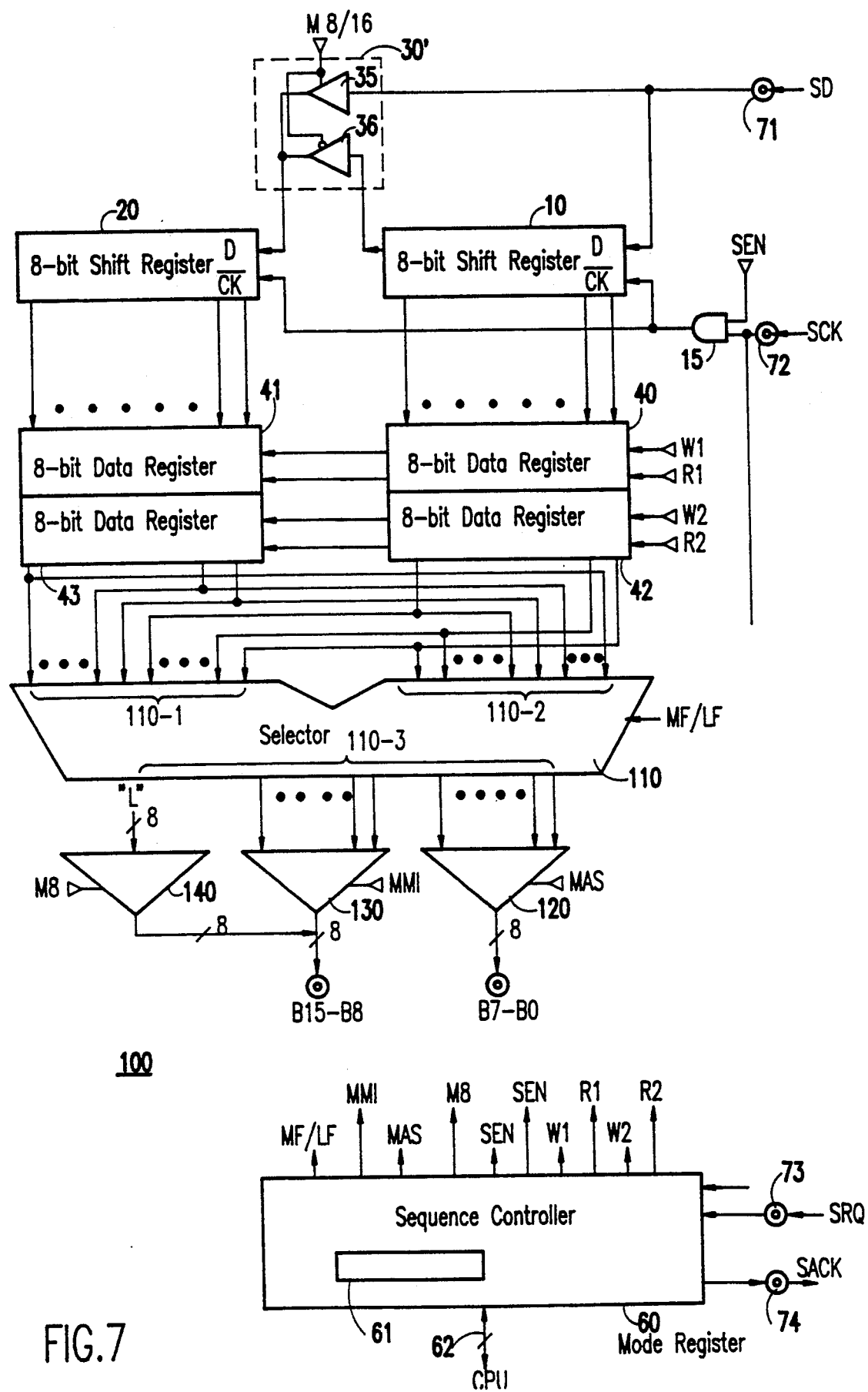
FIG. 7 is a block diagram illustrative of another embodiment of the present invention.

Turning to FIG. 7, there is illustrated a serial data receiving circuit 100 according to another embodiment of the present invention in which the same constituents as those shown in FIG. 1 are denoted by the same reference numerals to omit the further description thereof. In the present embodiment, the selection circuit 30' is composed of two tristate buffers 35 and 36. The buffer 36 is activated in the case of receiving 16-bit serial data, whereas the buffer 35 is activated in the case of receiving 8-bit serial data.

The 16-bit parallel data from the registers 40-41 (or 42-43) are supplied to a first set of input nodes 110-1 of a selector 110 without reversing the bit order thereof, further supplied to a second set of input nodes 110-2 thereof with reversing the bit order thereof by interconnection wiring layers. The selector 110 selects the input nodes 110-1 when a signal MF/LF takes the high level, i.e. when the serial data is supplied with the MSB thereof as the first input, and on the other hand selects the input nodes 110-2 when the signal MF/LF takes the low level to indicate that the serial data is supplied from the LSB thereof. The selected input nodes are connected to output nodes 110-3, respectively. The output nodes 110-3 are divided into two groups, the least significant 8-bit and the most significant 8-bit. The least significant 8-bit output nodes are connected through a tristate output buffer 120 to the output terminals B0-B7, respectively, and the most significant 8-bit output nodes are connected through a tristate output buffer 130 to the output terminals B8-B15. Further connected to the output terminals B8-B15 is a tristate output buffer 140 receiving the logic "0".

Upon the reception of 16-bit serial data, signals MMI and MAS are both changed to the active high level, so that the data derived from the selector 110 are supplied to the output terminals B0-B15. On the other hand, in the case of receiving 8-bit serial data, the signal MAS takes the active high level to activate the buffer 120, so that the least significant 8-bit data from the selector 110 are supplied to the output terminals B0-B7. Further, the signal M8 assumes the active high level to allow the buffer 104 to output the logic "0" to the output terminals B8-B15. That is, in the present embodiment, the 8-bit data appear at the least significant 8-bit terminals B0-B7 and the logic "0" appears at each of the most significant 8-bit output terminals B7-B15.

The above mentioned control signals are generated by a sequence controller 60 in response to the mode data of the mode register 61. Also in the present embodiment, the mode data "00", "10", "01" and "11" designate the modes (1), (2), (3) and (4), respectively. In the mode (1), the signal M8/16 takes the low level and the signal MF/LF takes the high level, the signals MMI and MAS both taking the active level, so that the 16-bit data transferred serially from the MSB thereof are converted into parallel data which are in turn supplied to the output terminals B15-B0, respectively, without reversing the bit order.

In mode (2), the signal M8/16 takes the high level and signal MF/LF also takes the high level, the signals MAS and M8 assuming the active level, so that the 8-bit serial data are supplied to the least significant eight output terminals B7-B0, respectively, without reversing the bit order and the logic "0" is supplied to each of the most significant eight output terminals B8-B15.

In mode (3), the signal M8/16 and MF/LF are at low level and signals MMI and MAS are at the active level. Accordingly, the 16-bit data are supplied to the output terminals B0-B15 reversing the bit order thereof.

Finally, in mode (4), the signal M8/16 is at the high level and signal MF/LF are at the low level. The signals MAS and M8 take the active level. Thus, the 8-bit serial data are supplied to the least significant eight terminals B0-B7 as parallel data with reversing the bit order and the logic "0" is supplied to each of the most significant eight terminals B8-B15.

Also in this embodiment, the serial data receiving circuit 100 performs the respective operations in four receiving modes.

It is apparent that the present invention is not limited to the above embodiments but may be modified and changed without departing from the scope and spirit of the invention. For example, the data registers 40-43 may be omitted. Further, the present invention is applicable to the combination of 32-bit and 16-bit, 8-bit and 4-bit or other bit length. Furthermore, the buffer 54 in FIG. 1 may be connected to the terminals B15-B and in that case, the activation of the buffers 51 and 53 are reversed. Similarly, the buffer 104 in FIG. 7 may be connected to the terminals B7-B0. Also in this case, the buffers 120 and 130 are activated in reversed manner.

What is claimed is:
1. A serial interface circuit comprising:
an input terminal supplied with serial data, a first shift register fetching and shifting data at said input terminal in synchronism with a clock signal, selector means for selecting said input terminal in a first mode and an output of said first shift register in a second mode, a second shift register fetching and shifting data at an output of said selector means in synchronism with said clock signal, said first and second shift registers having a set of parallel output nodes from which first and second data are derived, respectively, a set of first output terminals, a set of second output terminals, first transferring means for transferring said first and second data to said first and second output terminals in said second mode, and second transferring means for transferring one of said first and second data to one of said first and second output terminals in said first mode.

2. The circuit as claimed in claim 1, wherein said first transferring means includes a first tristate buffer having a set of input nodes supplied with said first data and a set of output nodes connected to said first output terminals and said second transferring means includes a second tristate buffer having a set of input nodes supplied with said second data and a set of output nodes connected to said second output terminals, both of said first and second tristate buffers being activated in said second mode and one of said first and second tristate buffers being activated in said first mode.

3. The circuit as claimed in claim 2, wherein said first transferring means further includes a third tristate buffer having a set of input nodes supplied each with a predetermined logic level and a set of output nodes connected to said first output terminals, both of said second and third tristate buffers being activated and said first tristate buffer being deactivated in said first mode.

4. The circuit as claimed in claim 2, said second transferring means further includes a third tristate buffer having a set of input nodes each supplied with a predetermined logic level and a set of output nodes connected to said second output terminals, both of said first and third tristate buffers being activated and said second tristate buffer being deactivated in said first mode.

5. A serial interface circuit comprising an input terminal supplied with serial data, a first shift register fetching and shifting data at said input terminal in synchronism with a clock signal, a selector for selecting said input terminal in a first mode and an output of said first shift register in a second mode, a second shift register fetching and shifting data at an output of said selector, said first and second shift registers having a set of parallel output nodes from which first and second data are derived, respectively, a set of first output terminals, a set of second output terminals, first transferring means for transferring said first and second data to said first and second output terminals with reversing bit orders of said first and second data, and second transferring means for transferring one of a said first and second data to one of said first and second output terminals with reversing the bit order of said one of said first and second data.

6. The circuit as claimed claim 5, wherein said first and second transferring means are constructed by including a first tristate buffer having a set of input nodes supplied with said first data with reversing the bit order thereof and a set of output nodes connected to second output terminals a second tristate buffer having a set of input nodes supplied with said second data with reversing the bit order thereof and a set of output nodes connected to said first output terminals, both of said first and second tristate buffers being activated in said second mode and one of said first and second tristate buffers being activated in said first mode.

7. A serial interface circuit comprising an input terminal supplied with serial data, a first shift register fetching and shifting data at said input terminal in synchronism with a clock signal, a selector for selecting said input terminal in a first and a second mode and for selecting an output of said first shift register in a third and a fourth mode, a second shift register fetching and shifting a data at an output of said selector, said first and second shift registers having a set of parallel output nodes from which first and second data are derived, respectively, a set of first output terminals, a set of second output terminals, first transferring means for transferring said first and second data to said first and second output terminals without reversing bit orders of said first and second data in said third mode, second transferring means for transferring said first and second data to said first and second output terminals with reversing the bit orders of said first and second data in said fourth mode, third transferring means for transferring one of said first and second data to one of said first and second output terminals without reversing the bit order of said one of said first and second data in said first mode, and fourth transferring means for transferring said one of said first and second data to said one of said first and second output terminals with reversing the bit order of said one of said first and second data in said second mode.

8. The circuit as claimed in claim 7, wherein said first to fourth means are constructed by including a first tristate buffer having a set of input nodes supplied with said first data without reversing the bit order of said first data and a set of output nodes connected to said first output terminals, a second tristate buffer having a set of input nodes supplied with said second data with reversing the bit order of said second data and a set of output nodes connected to said second output terminals, a third tristate buffer having a set of input nodes supplied with said second data without reversing the bit order of said second data and a set of output nodes connected to said second output terminals, and a fourth tristate buffer having a set of input nodes supplied with said second data with reversing the bit order of said second data and a set of output nodes connected to said first output terminals, only one of said first and third tristate buffers being activated in said first mode, only one of said second and fourth tristate buffers being activated in said second mode, only said first and third tristate buffers being activated in said third mode, and only said second and fourth tristate buffers being activated in said fourth mode.

9. The circuit as claimed in claim 7, said first and fourth transferring means are constructed by including a selection circuit having a set of first input nodes supplied with said first and second data without reversing the bit order of said first and second data, a set of second input nodes supplied with said first and second data with reversing the bit order of said first and second data, a set of least significant bit output nodes and a set of most significant bit output nodes, a first tristate buffer having a set of input nodes connected to said least significant bit output nodes and a set of output nodes connected to said first output terminals, and a second tristate buffer having a set of input nodes connected to said most significant bit output nodes and a set of output nodes connected to said second output terminals, said selection circuit selecting said first input nodes in said first and third modes and said second input nodes in said second and fourth modes, both of said first and second tristate buffers being activated in said second and third modes, and one of said first and second tristate buffers being activated in said first and fourth modes.

* * * * *